(12) United States Patent
Lee

(10) Patent No.: US 10,720,582 B2
(45) Date of Patent: Jul. 21, 2020

(54) RESISTANCE CHANGE MEMORY DEVICE HAVING AMORPHOUS CARBON STRUCTURE AND METHOD OF MANUFACTURING THE SAME

(71) Applicant: SK hynix Inc., Icheon-si (KR)

(72) Inventor: Sanghun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/101,764

(22) Filed: Aug. 13, 2018

(65) Prior Publication Data
US 2019/0123275 A1 Apr. 25, 2019

(30) Foreign Application Priority Data
Oct. 20, 2017 (KR) .................. 10-2017-0136886

(51) Int. Cl.
*H01L 45/00* (2006.01)
*H01L 27/24* (2006.01)

(52) U.S. Cl.
CPC ........ *H01L 45/149* (2013.01); *H01L 27/2463* (2013.01); *H01L 45/08* (2013.01); *H01L 45/1233* (2013.01); *H01L 45/1253* (2013.01); *H01L 45/165* (2013.01); *H01L 45/1625* (2013.01)

(58) Field of Classification Search
CPC . H01L 27/2463; H01L 45/08; H01L 45/1233; H01L 45/1253; H01L 45/149; H01L 45/1625; H01L 45/165
See application file for complete search history.

(56) References Cited

U.S. PATENT DOCUMENTS

| | | | |
|---|---|---|---|
| 8,030,637 B2 | 10/2011 | Ufert | |
| 8,754,392 B2 | 6/2014 | Caimi et al. | |
| 9,640,759 B1 * | 5/2017 | Curioni | ................ H01L 45/149 |
| 2008/0102278 A1 * | 5/2008 | Kreupl | ................ H01L 27/2436 428/408 |
| 2010/0032643 A1 * | 2/2010 | Xu | ....................... H01L 45/1641 257/4 |
| 2012/0043518 A1 * | 2/2012 | Cheng | ..................... C23C 16/26 257/4 |

OTHER PUBLICATIONS

"Oxygenated Amorphous Carbon for Resistive Memory Application", Santini et.al Nature Communications DOE: 10.1038/ncomms96001, Oct. 23, 2015.

* cited by examiner

*Primary Examiner* — Stephen W Smoot

(57) ABSTRACT

There is disclosed a resistance change memory device according to an aspect of the present disclosure. The resistance change memory device includes a first electrode layer and a second electrode layer that are disposed to be spaced apart from each other, and a resistance change material layer disposed between the first and second electrode layers and including an amorphous carbon structure. The resistance change material layer includes an impurity element adhering to the amorphous carbon structure, and the impurity element has a concentration gradient along a thickness direction of the resistance change material layer.

19 Claims, 11 Drawing Sheets

RESISTANCE CHANGE MEMORY DEVICE HAVING AMORPHOUS CARBON STRUCTURE AND METHOD OF MANUFACTURING THE SAME

CROSS-REFERENCE TO RELATED APPLICATION

The present application claims priority under 35 U.S.C 119(a) to Korean Patent Application No. 10-2017-0136886, filed on Oct. 20, 2017, which is herein incorporated by reference in its entirety.

BACKGROUND

1. Technical Field

Various embodiments of the present disclosure generally relate to a resistance change memory device and a method of manufacturing the same.

2. Related Art

Generally, a resistive memory means a non-volatile memory in which an internal resistance undergoes variable change in response to an externally applied voltage or current, and the change in internal resistance is recorded in a nonvolatile manner, and thereby a plurality of pieces of logic information can be stored. The resistive memory can be classified into a resistance change random access memory (RAM) device, a phase change RAM device, a magnetic RAM device, or the like according to a manner of changing the internal resistance.

Meanwhile, in the resistance change memory device, resistance can be variably changed by applying a voltage across a variable resistance material layer to generate or remove a conductive filament or an insulating interface layer in the variable resistance material layer. In addition, the changed internal resistance can be stored in a nonvolatile manner by allowing the changed or altered shape or continuity of the filament or the changed insulating interface layer to remain in the variable resistance material layer even after the applied voltage is removed.

SUMMARY

There is disclosed a resistance change memory device according to an aspect of the present disclosure. The resistance change memory device includes first and second electrode layers that are disposed to be spaced apart from each other, and a resistance change material layer, which includes an amorphous carbon structure, disposed between the first and second electrode layers. The resistance change material layer includes impurity elements adhering to the amorphous carbon structure, and the impurity element has a concentration gradient along a thickness direction of the resistance change material layer.

There is disclosed a method of manufacturing a resistance change memory device according to another aspect of the present disclosure. In the method, a first electrode layer is formed on a substrate. A resistance change material layer including an amorphous carbon structure is formed on the first electrode layer. A second electrode layer is formed on the resistance change material layer. Forming the resistance change material layer includes injecting an impurity element into the resistance change material layer such that the impurity element has a concentration gradient along a thickness direction of the resistance change material layer.

DETAILED DESCRIPTION

Figure 1:
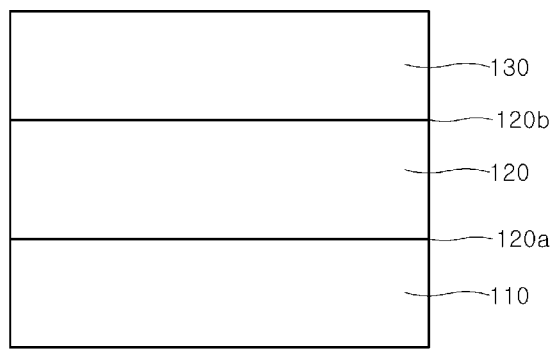
FIG. 1 is a cross-sectional view schematically illustrating a resistance change memory device according to an embodiment of the present disclosure.
Figure 1:
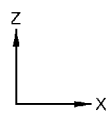

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise", "include" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

The terms "lower" or "upper" herein is not an absolute concept but may be a relative concept that can be interpreted by replacing "upper" or "lower", respectively, depending on the view point of the observer.

FIG. 1 is a cross-sectional view schematically illustrating a resistance change memory device 1 according to one embodiment of the present disclosure. Referring to FIG. 1, the resistance change memory device 1 may include a first electrode layer 110 and a second electrode layer 130 that are disposed to be spaced apart from each other, and a resistance change material layer 120 disposed between the first and second electrode layers 110 and 130.

The first and second electrode layers 110 and 130 may each include a conductive material. As an example, the first and second electrode layers 110 and 130 may each include platinum, gold, silver, tungsten, aluminum, copper, tantalum, ruthenium, iridium, molybdenum, tungsten nitride, titanium nitride, tantalum nitride, doped silicon, or a combination of two or more thereof. In one embodiment, the first and second electrode layers 110 and 130 may be formed of the same conductive material. In another embodiment, the first and second electrode layers 110 and 130 may each be formed of one or more different conductive materials.

The first electrode layer 110 may be disposed on a substrate (not illustrated). The substrate may include, for example, a semiconductor material. The substrate may, for example, be a silicon (Si) substrate, a gallium arsenide (GaAs) substrate, an indium phosphide (InP) substrate, a germanium (Ge) substrate, or a silicon germanium (SiGe) substrate. In one embodiment, the substrate may include an integrated circuit. In one embodiment, at least one insulating layer (not illustrated) may be disposed between the substrate and the first electrode layer 110. Also, at least one conductive layer (not illustrated) may be disposed between the substrate and the first electrode layer 110.

The resistance change material layer 120 may include an amorphous carbon structure. The amorphous carbon structure may have $sp^2$ hybridized ($sp^2$) bonds or $sp^3$ hybridized ($sp^3$) bonds as carbon to carbon atomic bonds. The $sp^2$ bond has a pi ($\pi$) bond between carbon atoms and may be a relatively weak bond compared to $sp^3$ bonds, which form sigma ($\delta$) bonds between carbon atoms and may be relatively strong bonds.

The $sp^2$ bond or $sp^3$ bond may be mutually or reversibly converted or switched by externally applied energy. As an example, the $sp^3$ bond forming a relatively strong bond can be converted into the $sp^2$ bond forming a relatively weak bond when energy with a minimum amount of a known or predetermined activation energy is externally applied or provided. Likewise, the $sp^2$ bond forming a relatively weak bond can be converted into the $sp^3$ bond forming a relatively strong bond when energy with at least a given or predetermined activation energy is externally provided or applied. The external energy source may, for example, take form of an electrical bias or heat.

Meanwhile, depending on the proportion of $sp^2$ bonds to $sp^3$ bonds in the amorphous carbon structure, the resistance change material layer 120 may have an electrical resistance that varies according to the $sp^2/sp^3$ bond ratio. As an example, when the proportion of the $sp^2$ bond of the amorphous carbon structure increases, the electrical resistance of the resistance change material layer 120 may decrease. As another example, when the proportion of the sp3 bond of the amorphous carbon structure increases, the electrical resistance of the resistance change material layer 120 may increase.

In one embodiment, the resistance change material layer 120 may include an impurity element. The impurity element can adhere to the amorphous carbon structure. At least a portion of the impurity element may adhere to the carbon atoms of the amorphous carbon structure in the resistance change material layer 120. As an example, the impurity element may be adsorbed into the amorphous carbon structure in a non-chemical bonding state, i.e., without forming complete covalent bonds with carbon atoms of the amorphous carbon structure. Further, at least a portion of the impurity element may be detached from the amorphous carbon structure. The detached portion of the impurity element may be distributed in the form of an atom, a molecule or a functional group in the resistance change material layer 120. As examples, the impurity element may be or include oxygen or hydrogen.

In one example, oxygen may adhere in a form of adsorption to the carbon atom of the amorphous carbon structure in the resistance change material layer 120. At this time, the adsorbed oxygen does not form a strong bonding state such as a covalent bond with the carbon atom, however, oxygen may interact with $sp^2$ and $sp^3$ carbon to carbon bonds. The amorphous carbon structure to which oxygen adheres may have an $sp^2$ bond and an $sp^3$ bond as carbon to carbon atomic bonds. At this time, as an amount of oxygen adhering to the amorphous carbon structure decreases, a proportion of the $sp^2$ bond of the amorphous carbon structure may increase. On the other hand, as an amount of oxygen adhering to the amorphous carbon structure increases, a proportion of the $sp^3$ bond of the amorphous carbon structure may increase. As a result, when the amount of oxygen adhering to the amorphous carbon structure decreases, a resistance of the amorphous carbon structure can be relatively reduced. On the other hand, when the amount of oxygen adhering to the amorphous carbon structure increases, the resistance of the amorphous carbon structure can be relatively increased.

When forming the resistance change material layer 120, the amount of oxygen adhering to the amorphous carbon structure can be controlled by supplying a predetermined amount of oxygen gas into the resistance change material layer 120. Accordingly, the resistance of the resistance change material layer 120 in an initial state of the resistance change memory device 1 can be predictably determined by controlling the proportions of $sp^2$ bond and $sp^3$ bond in the amorphous carbon structure through the introduction of oxygen.

The electrical properties of the oxygen-adhered amorphous carbon structures are described, for example, in a paper by Claudia A. Santini et al., entitled "*Oxygenated Amorphous Carbon for Resistive Memory Application*", Nature Communications DOE: 10.1038/comms9600 published Oct. 23, 2015, which is incorporated herein by reference. The configuration of the oxygen-adhered amorphous carbon structure disclosed in the above paper can be applied to the embodiments of the present disclosure.

In another example, in the resistance change material layer 120, hydrogen may adhere in a form of adsorption to the carbon atom of the amorphous carbon structure. At this time, the adsorbed hydrogen does not form a strong bonding state such as a covalent bond with the carbon atoms, however, hydrogen may interact with $sp^2$ and $sp^3$ carbon to carbon bonds.

The hydrogen-adhered amorphous carbon structure may have an $sp^2$ bond and an $sp^3$ bond as carbon to carbon atomic bonds. At this time, as the amount of hydrogen adhering to the amorphous carbon structure decreases, the proportion of the $sp^2$ bond of the amorphous carbon structure may increase. On the other hand, as the amount of hydrogen adhering to the amorphous carbon structure increases, the proportion of the $sp^3$ bond of the amorphous carbon structure may increase. As a result, when the amount of hydrogen adhering to the amorphous carbon structure decreases, the electrical resistance of the amorphous carbon structure can be decreased. On the other hand, when the amount of hydrogen adhering to the amorphous carbon structure increases, the electrical resistance of the amorphous carbon structure can be increased.

When forming the resistance change material layer 120, the amount of hydrogen adhering to the amorphous carbon structure can be controlled by supplying a predetermined amount of hydrogen gas into the resistance change material layer 120. Accordingly, the electrical resistance of the resistance change material layer 120 in an initial state of the resistance change memory device 1 can be predictably determined by controlling the proportions of $sp^2$ bond and $sp^3$ bond of the amorphous carbon structure through the introduction of hydrogen.

In yet another example, when forming the resistance change material layer 120, oxygen gas and hydrogen gas, each controlled in predetermined amounts, may be simultaneously supplied into the resistance change material layer 120 to control the specific amounts of oxygen and hydrogen adhering to the amorphous carbon structure. As a result, the electrical resistance of the resistance change material layer 120 in an initial state of the resistance change memory device 1 can be predictably determined depending on the controlled proportions of $sp^2$ bonds and $sp^3$ bonds of the amorphous carbon structure in conjunction with the introduction of oxygen and hydrogen.

Referring back to FIG. 1, the impurity element in the resistance change material layer 120 may have a concentration gradient along a thickness direction of the resistance change material layer 120, that is, a z direction. In one embodiment, the impurity element may have a concentration gradient that increases or decreases from a first interface 120a, between the resistance change material layer 120 and the first electrode layer 110, to a second interface 120b between the resistance change material layer 120 and the second electrode layer 130. In an example, oxygen that functions as the impurity element in the resistance change material layer 120 may have a concentration gradient that increases or decreases from the first interface 120a, between the resistance change material layer 120 and the first electrode layer 110, to the second interface 120b between the resistance change material layer 120 and the second electrode layer 130. In another example, hydrogen that functions as the impurity element in the resistance change material layer 120 may have a concentration gradient that increases or decreases from the first interface 120a, between the resistance change material layer 120 and the first electrode layer 110, to the second interface 120b between the resistance change material layer 120 and the second electrode layer 130. In yet another example, both oxygen and hydrogen functioning as the impurity elements in the resistance change material layer 120 may each have concentration gradients that both increase or both decrease from the first interface 120a, between the resistance change material layer 120 and the first electrode layer 110, to the second interface 120b between the resistance change material layer 120 and the second electrode layer 130.

As described above, when a concentration gradient of one or more impurity elements is formed in the resistance change material layer 120, the proportions of the $sp^2$ bond and $sp^3$ bond between carbon atoms in the amorphous carbon structure may vary along the concentration gradient. Accordingly, as will be described later, when energy is supplied to the resistance change material layer 120 by an applied forming voltage, conductive filaments may be generated or formed by the carbon atoms having $sp^2$ bonds in a region having carbon with a high proportion of $sp^2$ bonds, which corresponds to a region in the concentration gradient with a lower amount of the impurity element (refer to FIG. 4). The conductive filaments can reduce the resistance of the resistance change material layer 120 by connecting, or electrically bridging, the first and second electrode layers 110 and 130 to each other. A state in which conductive filaments are formed and the electrical resistance of the resistance change material layer 120 is reduced may be referred to as a 'low resistance state'. The generated filaments may remain after the forming voltage is removed, so that the low resistance state of the resistance change material layer 120 can be stored as signal information. As such, an operation of applying a forming voltage to convert the state of the resistance change material layer 120 into the low resistance state for the first time may be referred to as a 'forming operation'.

In addition, when energy is supplied to the resistance change material layer 120 by an external reset voltage, the conductive filaments may be locally disconnected or partially degraded in a region of the amorphous carbon structure with a high proportion of $sp^3$ bonds, which corresponds to a region in the concentration gradient with a higher amount of the impurity element in the resistance change material layer 120. The region of the amorphous carbon structure with a high proportion of $sp^3$ bonds depends on the concentration gradient of the impurity element (refer to FIG. 5). The resistance of the resistance change material layer 120 may increase due to the disconnection of the conductive filaments. A state in which the electrical resistance is increased may be referred to as a 'high resistance state' as compared with the low resistance state before the reset voltage is applied. The conductive filaments may maintain a locally disconnected form even after the reset voltage is removed, so that the high resistance state of the resistance change material layer 120 can be stored as signal information. As such, an operation of applying the reset voltage to convert the state of the resistance change material layer 120 from the low resistance state into the high resistance state may be referred to as a 'reset operation'.

Figure 5:
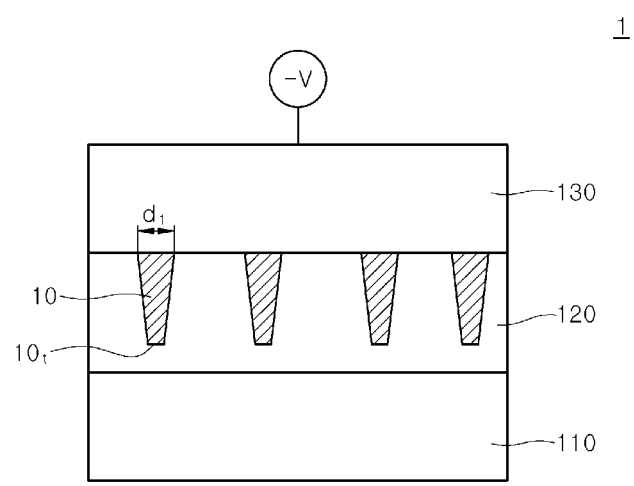

In addition, when a set voltage is applied to the resistance change material layer 120 after the reset operation, an electric field formed in the resistance change material layer 120 results in concentration of energy at tip $10_t$ of the conductive filament, as illustrated in FIG. 5, because resistance is lower in the conductive filament 10. As a result, the carbon atoms in $sp^2$ bonds may be re-assembled to the disconnected portion of the conductive filament, and the conductive filament can be restored. The first and second electrode layers 110 and 130 are connected to each other by the restored conductive filament, so that the resistance state of the resistance change material layer 120 can be converted from the high resistance state into the low resistance state. The restored conductive filaments may keep the restored forms even after the set voltage is removed, so that the low resistance state of the resistance change material layer 120 can be stored as signal information. An operation of converting the state of the resistance change material layer 120 from the high resistance state into the low resistance state by applying the set voltage in this manner may be referred to as a 'set operation'.

As described above, a concentration gradient of the impurity element can be formed in the resistance change material layer 120, so that the shape of the conductive filaments formed in the resistance change material layer 120 can be uniformly or predictably controlled. Therefore, the generation and restoration positions of the conductive filaments are effectively controlled when the forming voltage and the set voltage are respectively applied to the resistance change material layer 120 and the disconnection position of the conductive filaments are effectively controlled when the reset voltage is applied to the resistance change material layer 120. As a result, the reliability of the forming operation, the set operation, or the reset operation of the resistance change memory device can be improved.

Figure 2A:
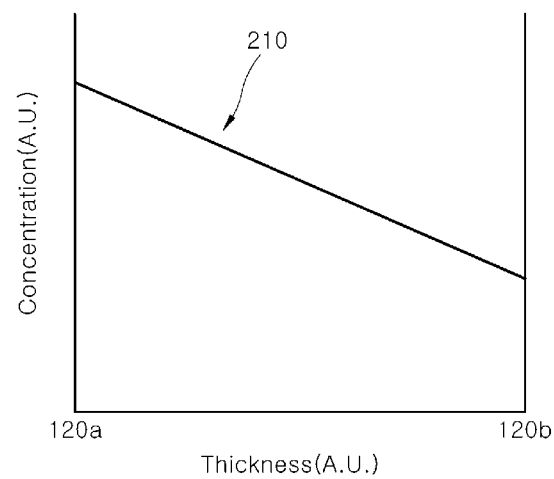
FIGS. 2A and 2B are views schematically illustrating a concentration gradient of an impurity element in a resistance change material layer according to an embodiment of the present disclosure.
Figure 2B:
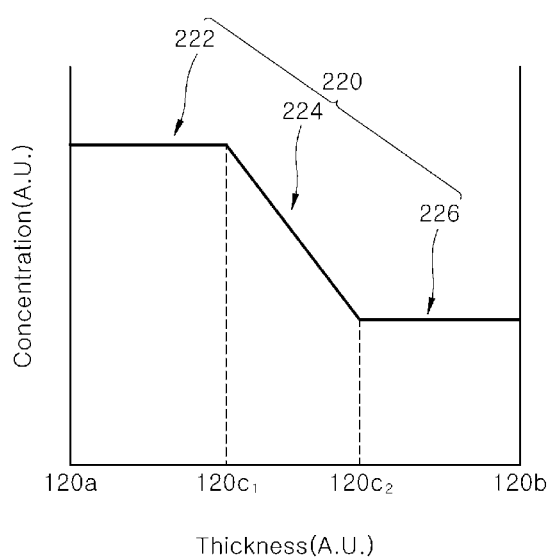
Figure 3A:
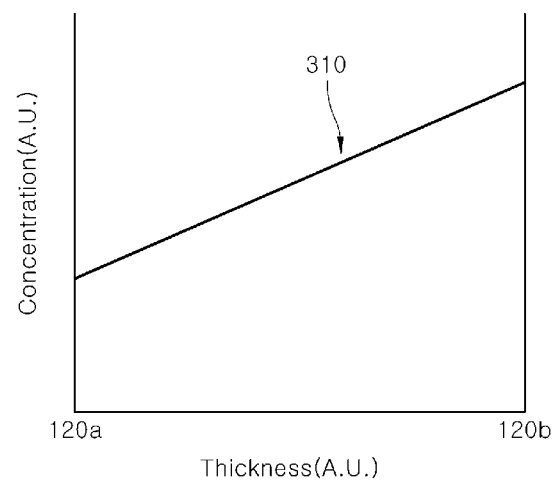
FIGS. 3A and 3B are views schematically illustrating a concentration gradient of an impurity element in a resistance change material layer according to another embodiment of the present disclosure.
Figure 3B:
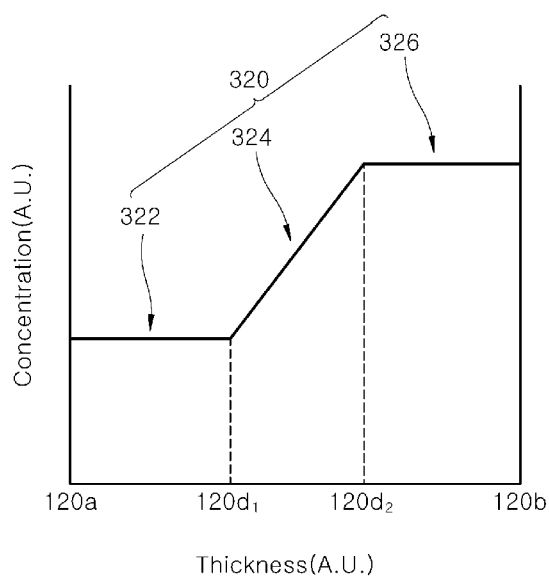

FIGS. 2A and 2B are views schematically illustrating concentration gradients of an impurity element in a resistance change material layer according to an embodiment of the present disclosure. FIGS. 3A and 3B are views schematically illustrating concentration gradients of an impurity element in a resistance change material layer according to another embodiment of the present disclosure. The impurity element may, as non-limiting examples, take the form of an atom, an ion, a molecule, or a functional group in the resistance change material layer. The impurity element may, as examples, include hydrogen or oxygen.

Referring to a concentration gradient graph 210 of FIG. 2A, the concentration of the impurity element may decrease monotonically along a thickness direction of the resistance change material layer 120, that is, a z direction of FIG. 1, from the first interface 120a to the second interface 120b.

Referring to a concentration gradient graph 220 of FIG. 2B, the concentration of the impurity element may decrease along the thickness direction of the resistance change material layer 120 from the first interface 120a to the second interface 120b. More specifically, the concentration of the impurity element may be substantially identically maintained along a first portion 222 of the concentration gradient graph 220 from the first interface 120a to a first thickness point $120c_1$ along the thickness direction of the resistance change material layer 120. The concentration of the impurity element may decrease monotonically along a second portion 224 of the concentration gradient graph 220 from the first thickness point $120c_1$ to a second thickness point $120c_2$. The concentration of the impurity element may be substantially identically maintained along a third portion 226 of the concentration gradient graph 220 from the second thickness point $120c_2$ to the second interface 120b. In other words, the concentration of the impurity element may remain constant in at least some regions of the resistance change material layer 120 along the thickness direction of the resistance change material layer 120, but as a whole, the concentration of the impurity element in a region of the resistance change material layer 120 near the second interface 120b may be lower than the concentration of the impurity element in a region of the resistance change material layer 120 near the first interface 120a.

Although not illustrated in FIG. 2B, in some other embodiments, a region where the concentration of the impurity element is locally increased along the thickness direction of the resistance change material layer 120 may occur in a portion of the resistance change material layer 120. However, as a whole, the concentration gradient may be formed such that the concentration of the impurity element in the region of the resistance change material layer 120 near the first interface 120a is higher than the concentration of the impurity element in the region of the resistance material layer 120 near the second interface 120b.

In some other embodiments, a concentration gradient of at least two kinds of impurity element may be formed in the resistance change material layer 120. As an example, oxygen and hydrogen as the impurity elements may exhibit concentration gradients in which the concentrations of both the oxygen and the hydrogen decrease along the thickness direction of the resistance change material layer 120 from the first interface 120a to the second interface 120b. The concentration gradients of oxygen and hydrogen need not be identical.

Meanwhile, referring to a concentration gradient graph 310 of FIG. 3A, in an embodiment, the concentration of the impurity element may increase monotonically along the thickness direction of the resistance change material layer 120, that is, the z direction of FIG. 1, from the first interface 120a to the second interface 120b.

Referring to a concentration gradient graph 320 of FIG. 3B, the concentration of the impurity element may increase along the thickness direction of the resistance change material layer 120, from the first interface 120a to the second interface 120b. Specifically, the concentration of the impurity element may be substantially identically maintained along a first portion 322 of the concentration gradient graph 320 from the first interface 120a to a first thickness point $120d_1$ along the thickness direction. The concentration of the impurity element may increase monotonically along a second portion 324 of the concentration gradient graph 320 from the first thickness point $120d_1$ to a second thickness point $120d_2$. The concentration of the impurity element may be substantially identically maintained along a third portion 326 of the concentration gradient graph 320 from the second thickness point $120d_2$ to the second interface 120b. In other words, the concentration of the impurity element may remain constant in at least some regions of the resistance change material layer 120 along the thickness direction of the resistance change material layer 120, but as a whole, the concentration of the impurity element in the region of the resistance change material layer 120 near the second interface 120b may be higher than the concentration of the impurity element in the region of the resistance change material layer near the first interface 120a.

Although not illustrated in FIG. 3B, in some other embodiments, in the resistance change material layer 120, a region where the concentration of the impurity element locally decreases along the thickness direction of the resistance change material layer 120 may occur in a portion of the resistance change material layer 120. However, as a whole, the concentration gradient may be formed such that the concentration of the impurity element at the second interface 120b is higher than the concentration of the impurity element at the first interface 120a.

In some other embodiments, a concentration gradient of at least two kinds of impurity elements may be formed in the resistance change material layer 120. As an example, oxygen and hydrogen as the impurity elements may exhibit concentration gradients in which the concentrations all increase along the thickness direction of the resistance change material layer 120 from the first interface 120a to the second interface 120b. The concentration gradients of oxygen and hydrogen need not be identical.

Figure 4:
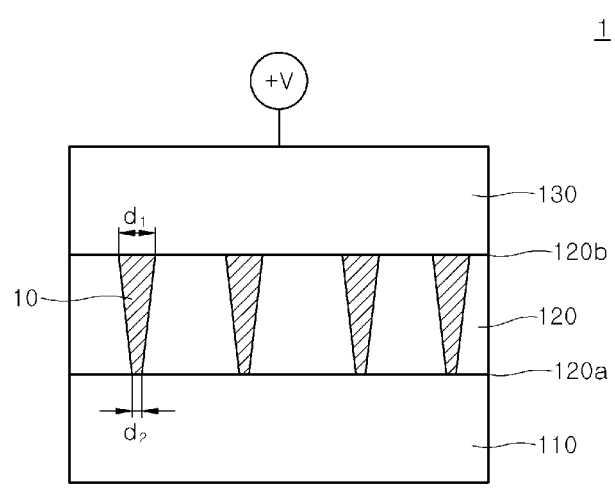
FIGS. 4 to 6 are views schematically illustrating a method of driving a resistance change memory device according to one embodiment of the present disclosure.
Figure 6:
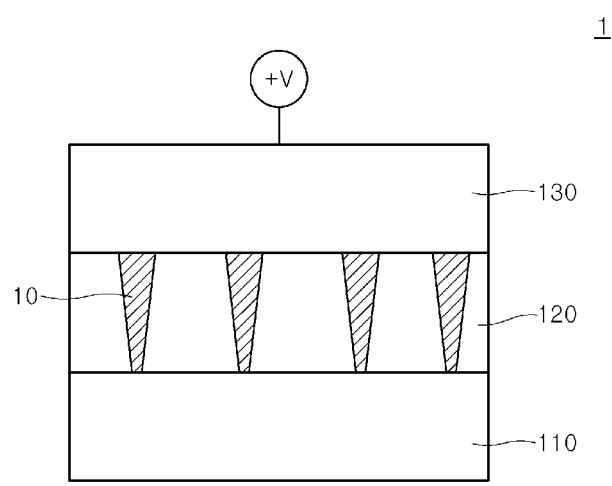

FIGS. 4 to 6 are views schematically illustrating a method of operating a resistance change memory device according to one embodiment of the present disclosure.

Referring to FIG. 4, a resistance change memory device 1 is provided. The resistance change memory device 1 may be substantially the same in configuration as the resistance change memory device 1 described above with reference to FIG. 1. In addition, a resistance change material layer 120 of the resistance change memory device 1 may have a concentration gradient of an impurity element of the resistance change material layer 120 described above with reference to FIG. 2A or FIG. 2B. In other words, the concentration of the impurity element in the resistance change material layer 120 may decrease along a thickness direction of the resistance change material layer 120 from a first interface 120a to a second interface 120b. In another example, if the resistance change material layer 120 includes two or more kinds of impurity elements, then the two or more kinds of impurity elements may have concentration gradients that both decrease along the thickness direction of the resistance change material layer 120.

Accordingly, the carbon to carbon atomic bonds of the amorphous carbon structure in the resistance change material layer 120 nearer the first interface 120a may have a relatively high proportion of $sp^3$ bonds as compared to $sp^2$ bonds, and the carbon to carbon atomic bonds of the amorphous carbon structure in the resistance change material layer 120 closer to the second interface 120b may have a comparatively higher proportion of $sp^2$ bonds than $sp^3$ bonds.

Next, a forming operation may be performed by applying a forming voltage between a first electrode layer 110 and a second electrode layer 130. The forming voltage is a first driving voltage that is applied to a resistance change memory device 1 in an initial state for an operation after the fabrication of the resistance change memory device 1. In FIG. 4, in an embodiment, a positive bias may be applied to the second electrode layer 130, and the first electrode layer 110 may be electrically grounded or a relatively negative bias may be applied to the first electrode layer 110. In another embodiment not illustrated, the forming operation may be performed by applying a positive bias to the first electrode layer 110, and electrically grounding the second electrode layer 130 or applying a negative bias to the second electrode layer 130. That is, if the concentration gradient of the impurity maintains in the resistance change material layer 120, the polarity of the forming voltage may not have any effect on the generation of the conductive filaments 10 as shown in FIG. 4.

When the forming voltage is applied between the first and second electrode layers 110 and 130, energy may be supplied to the resistance change material layer 120 by the applied forming voltage. At this time, the resistance change material layer 120 may function as a resistor having a predetermined resistance. The forming voltage can supply thermal energy generated by joule heating in the resistance change material layer 120. The thermal energy may convert an $sp^3$ bond between carbon atoms to an $sp^2$ bond, so that the conductive filaments 10 may be formed by the carbon atoms having the converted $sp^2$ bond. In one embodiment, the conductive filament 10 may be initially generated in an inner region of the resistance change material layer 120 adjacent to the second interface 120b, which has a higher proportion of $sp^2$ bonds and, may grow toward the first interface 120a in the thickness direction of the resistance change material layer 120. The conductive filaments 10 generated by the forming voltage may connect the first and second electrode layers 110 and 130 to each other so that the resistance state of the resistance change material layer 120 can be converted or changed into a low resistance state.

In an embodiment, a cross-sectional area of the conductive filament 10 located in a region having a relatively low impurity element concentration may be greater than a cross-sectional area of the conductive filament 10 located in a region having a relatively high impurity element concentration. Referring to FIG. 4, as an example, in the conductive filament 10, a diameter $d_1$ of the upper portion adjacent to the second interface 120b may be greater than a diameter $d_2$ of the lower portion adjacent to the first interface 120a. As another example, the cross-sectional area of the conductive filament 10 at the second interface 120b may be greater than the cross-sectional area at the first interface 120a. As another example, the conductive filament 10 may have a conical shape in which the conical diameter decreases from a major diameter at the conical base, at or near second interface 120b where a larger proportion of $sp^2$ bonds can be found, to a minor diameter at or near first interface 120a, where a higher number of $sp^3$ bonds can be found as the ratio of $sp^2$ to $sp^3$ bonds decreases along the conical height.

Referring to FIG. 5, a reset voltage may be applied between the first and second electrode layers 110 and 130 to perform a reset operation. In an embodiment, a bias polarity of the reset voltage may be opposite to a bias polarity of the forming voltage. That is, the resistance change memory device 1 may operate in a bipolar switching mode, which has the opposite polarities between the forming voltage and the reset voltage. Alternatively, the bias polarity of the reset voltage may be the same as the bias polarity of the forming voltage. That is, the resistance change memory device 1 may operate in a unipolar switching mode, which has the same polarity between the forming voltage and the reset voltage. In the unipolar switching mode, the size of the reset voltage is smaller than that of the forming voltage.

In FIG. 5, in an embodiment, a negative bias may be applied to the second electrode layer 130, and the first electrode layer 110 may be electrically grounded or a relatively positive bias may be applied to the first electrode layer 110 to perform the reset operation in the bipolar switching mode. In another embodiment, a positive bias may be applied to the second electrode layer 130, and the first electrode layer 110 may be electrically grounded or a relatively positive bias may be applied to the first electrode layer 110 in the unipolar switching mode. When the reset voltage is applied between the first and second electrode layers 110 and 130, energy may be supplied to the resistance change material layer 120 by the applied reset voltage. The reset voltage may supply the conductive filament 10 with thermal energy generated by joule heating. The thermal energy may convert an $sp^2$ bond of the amorphous carbon structure in the conductive filament 10 into an $sp^3$ bond so that a portion of the conductive filament 10 can be removed, converted or degraded. Removal or degradation of a portion of the conductive filament 10 may occur in a region of the resistance change material layer 120 adjacent to the first interface 120a, where the width of the conductive filament 10 is relatively narrow due to the high proportion of $sp^3$ bonds. The portion of the conductive filament 10 is removed or degraded by the reset voltage, so that the conductive filament 10 is effectively disconnected between the first and second electrode layers 110 and 130, and the resistance state of the resistance change material layer 120 may be converted or switched into an electrically high resistance state. In this embodiment, the reset operation is effectively performed because the removal position of the conductive filament 10 is located at the position where the conductive filament 10 has a relatively narrow width adjacent to the first interface 120a.

Referring to FIG. 6, a set voltage may be applied between the first and second electrode layers 110 and 130 to perform a set operation. In one embodiment, a bias polarity of the set voltage may be opposite to the bias polarity of the reset voltage. That is, the resistance change memory device 1 may operate in a bipolar switching mode, which has the opposite polarities between the set voltage and the reset voltage. Alternatively, the bias polarity of the set voltage may be the same as the bias polarity of the reset voltage. That is, the resistance change memory device 1 may operate in a unipolar switching mode, which has the same polarity between the set voltage and the reset voltage. In the unipolar switching mode, the size of the set voltage is different from that of the reset voltage.

In one embodiment, a positive bias may be applied to the second electrode layer 130, and the first electrode layer 110 may be electrically grounded or a relatively negative bias may be applied to the first electrode layer 110 to perform the set operation.

When the set voltage is applied between the first and second electrode layers 110 and 130, energy may be supplied to the resistance change material layer 120 by the applied set voltage. The set voltage may concentrate an electric field on a tip $10_t$ of the conductive filament 10, illustrated in FIG. 5, the portion of which is disconnected. The concentrated electric field may generate thermal energy by joule heating to an area of the resistance change material layer 120 adjacent to the tip $10_t$ of the conductive filament 10. The thermal energy may convert $sp^3$ bonds of the amorphous carbon structure into $sp^2$ bonds so that the disconnected portion of the conductive filament 10 can be restored. The conductive filament 10 may re-form to connect the first and second electrode layers 110 and 130 to each other, so that the resistance state of the resistance change material layer 120 may be switched or changed into a low resistance state.

In some other embodiments, unlike that illustrated in FIGS. 4 to 6, the resistance change material layer 120 may have a concentration gradient of the impurity element described above with reference to FIG. 3A or 3B. In this case, when a forming voltage is applied between the first and second electrode layers 110 and 130, the conductive filaments 10 may start forming in the inner region of the resistance change material layer 120 adjacent to the first interface 120a having a high proportion of $sp^2$ bonds and grow toward the second interface 120d. The diameter of the lower portion of the conductive filament 10 adjacent to the first interface 120a may be greater than the diameter of the upper portion of the conductive filament 10 adjacent to the second interface 120b. That is, the cross-sectional area of the conductive filament 10 at the first interface 120a may be greater than the cross-sectional area at the second interface 120b.

In addition, when the reset voltage is applied between the first and second electrode layers 110 and 130, the conductive filament 10 may be disconnected or degraded in the resistance change material layer 120 adjacent to the second interface 120b having a greater proportion of $sp^3$ bonds. Then, when the set voltage is applied between the first and second electrode layers 110 and 130, the conductive filament 10 may be restored from the disconnected tip $10_t$ of the conductive filament 10.

As described above, according to one embodiment of the present disclosure, the proportions of $sp^2$ bonds and $sp^3$ bonds between carbon atoms in the amorphous carbon structure can be controlled by controlling the concentration gradient of the impurity element. As a result, conductive filaments may be produced from an area in the resistance change material layer having a high proportion of $sp^2$ bonds compared to $sp^3$ bonds when the forming operation is performed. Further, the conductive filament may be disconnected or degraded in a region of the resistance change material layer with a high proportion of $sp^3$ bonds compared to $sp^2$ bonds.

Accordingly, the shape of the conductive filaments generated in the resistance change material layer may be uniformly or predictably controlled. In addition, the generation and restoration positions of the conductive filaments are effectively controlled when the forming voltage and the set voltage are respectively applied to the resistance change material layer 120 and the disconnection position of the conductive filaments are effectively controlled when the reset voltage is applied to the resistance change material layer 120. As a result, the reliability of the forming operation, the reset operation, and the set operation of the resistance change memory device can be improved.

Figure 7:
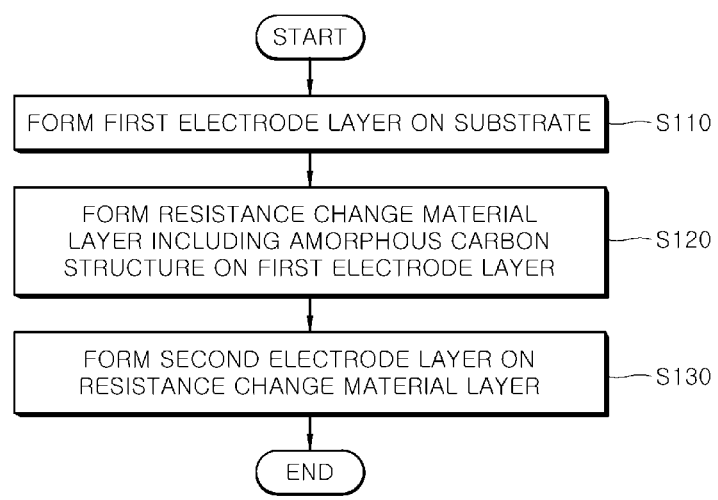
FIG. 7 is a flow chart schematically illustrating a method of manufacturing a resistance change memory device according to one embodiment of the present disclosure.

FIG. 7 is a flow chart schematically illustrating a method of manufacturing a resistance change memory device according to an embodiment of the present disclosure. The manufacturing method described below with reference to FIG. 7 can be applied to a manufacturing method of the resistance change memory device 1 described above with reference to FIGS. 1, 2A, 2B, 3A, and 3B.

Referring to operation S110 of FIG. 7, a first electrode layer may be formed on a substrate. The substrate may include, for example, a semiconductor material. The substrate may, for example, be a silicon (Si) substrate, a gallium arsenide (GaAs) substrate, an indium phosphide (InP) substrate, a germanium (Ge) substrate, or a silicon germanium (SiGe) substrate. The substrate may include an integrated circuit.

The first electrode layer may include a conductive material. As an example, the first electrode layer may include platinum, gold, silver, tungsten, aluminum, copper, tantalum, ruthenium, iridium, molybdenum, tungsten nitride, titanium nitride, tantalum nitride, doped silicon, or a combination of two or more thereof. The first electrode layer may, for example, be formed using chemical vapor deposition, physical vapor deposition, atomic layer deposition or the like. The physical vapor deposition may include, for example, evaporation, sputtering, electron beam deposition or the like.

Referring to operation S120 of FIG. 7, a resistance change material layer including an amorphous carbon structure may be formed on the first electrode layer. In an embodiment, the resistance change material layer may be formed with impurity elements injected into the resistance change material layer. The impurity element may have a concentration gradient along a thickness direction of the resistance change material layer. In other words, the concentration of the impurity element may continuously or monotonically increase or decrease along the thickness direction of the resistance change material layer.

In an embodiment, at least a portion of the impurity elements injected into the resistance change material layer may adhere to the amorphous carbon structure. As one example, the impurity elements may be adsorbed to the amorphous carbon structure in a non-chemically bonded state.

In an embodiment, the resistance change material layer may be formed such that the concentration of impurities in an inner region of the resistance change material layer adjacent to an interface between the first electrode layer and the resistance change material layer, and the concentration of impurities in an inner region of the resistance change material layer adjacent to an interface between the second electrode layer and the resistance change material layer, are different from each other.

The impurity element may be, for example, oxygen or hydrogen. In an embodiment, the oxygen in the resistance change material layer may be controlled to have a concentration gradient that increases or decreases from the interface, between the resistance change material layer and the first electrode layer, to the interface between the resistance change material and the first electrode layer. In another embodiment, the hydrogen in the resistance change material layer may be controlled to have a concentration gradient that increases or decreases from the interface, between the resistance change material layer and the first electrode layer, to the interface between the resistance change material and the first electrode layer. In yet another embodiment, both the oxygen and hydrogen are impurity elements in the resistance change material layer, and are formed with concentration gradients that both increase or both decrease from the interface, between the resistance change material layer and the first electrode layer, to the interface between the resistance change material and the first electrode layer.

In an embodiment, the resistance change material layer may be formed using a reactive sputtering process with a carbon target and using oxygen or hydrogen as a reactive gas. The carbon target may include, for example, a graphite target. In an embodiment, at the beginning of the sputtering process, oxygen gas may be injected at a predetermined flow rate, and the flow rate of the oxygen gas may be reduced as the thickness of the resistance change material layer, including the amorphous carbon structure, increases as the sputtering process proceeds. Accordingly, a concentration gradient in which the oxygen concentration decreases from the interface, between the first electrode layer and the resistance change material layer, to the upper surface of the resistance change material layer can be formed. In another embodiment, a small amount of the oxygen gas may be injected at the beginning of the sputtering process and the flow rate of the oxygen gas may be increased as the thickness of the resistance change material layer, including the amorphous carbon structure, increases as the sputtering process proceeds. Thus, a concentration gradient in which the oxygen concentration increases from the interface, between the first electrode layer and the resistance change material layer, to the upper surface of the resistance change material layer can be formed.

In yet another embodiment, a concentration gradient in which the hydrogen concentration in the resistance change material layer increases or decreases may be formed by reducing or increasing the flow rate of the hydrogen gas supplied to the resistance change material layer during formation of the resistance change material layer, including the amorphous carbon structure, using a sputtering process. That is, as an example, a predetermined flow rate of the hydrogen gas is injected at the beginning of the sputtering process and the flow rate of the hydrogen gas may be decreased as the thickness of the resistance change material layer, including the amorphous carbon structure, increases with the progress of the sputtering process. As another example, a small amount of the hydrogen gas may be injected at the beginning of the sputtering process and the flow rate of the hydrogen gas may be increased as the thickness of the resistance change material layer, including the amorphous carbon structure, increases with the progress of the sputtering process.

As yet another example, when the oxygen gas and the hydrogen gas are simultaneously injected into the resistance change material layer, the flow rates of the oxygen gas and the hydrogen gas may each be controlled so that the oxygen concentration and the hydrogen concentration both increase or both decrease along the thickness direction of the resistance change material layer.

In some other embodiments, as a method of forming the resistance change material layer, chemical vapor deposition methods or atomic layer deposition methods may be used. However, the hydrogen gas or the oxygen gas may be supplied in a controlled flow rate, as described above, during thin film deposition in accordance with chemical vapor deposition or atomic layer deposition. Through the control of the flow rate, the concentration of hydrogen or oxygen in the resistance change material layer may be increased or decreased along the thickness direction of the layer.

Referring to operation S130 of FIG. 7, a second electrode layer may be formed on the resistance change material layer. The second electrode layer may include a conductive material. As an example, the second electrode layer may include platinum, gold, silver, tungsten, aluminum, copper, tantalum, ruthenium, iridium, molybdenum, tungsten nitride, titanium nitride, tantalum nitride, doped silicon, or a combination of two or more thereof. The second electrode layer may be formed of the same conductive material as the first electrode layer, or alternatively, the second electrode layer may be formed of one or more different conductive material from the first electrode layer. The second electrode layer may, for example, be formed using chemical vapor deposition, physical vapor deposition, atomic layer deposition or the like. The physical vapor deposition may include, for example, evaporation, sputtering, electron beam deposition, or the like. By performing the above-described operations S110 to S130, the resistance change memory device according to an embodiment of the present disclosure can be manufactured.

Figure 8:
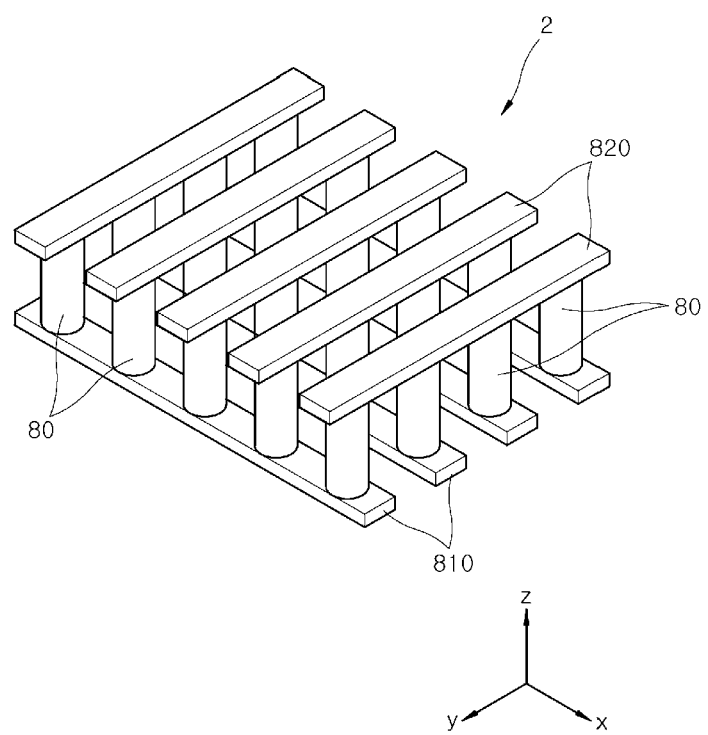
FIG. 8 is a perspective view schematically illustrating a nonvolatile memory device of a three-dimensional structure.
Figure 9:
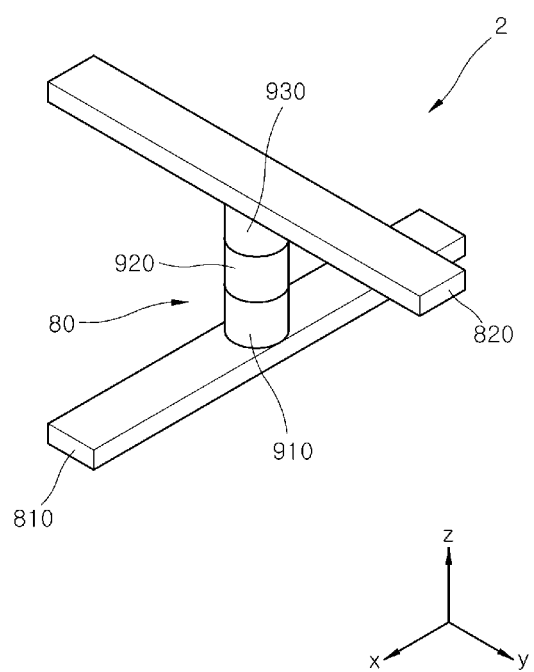
FIG. 9 is a partial enlarged view of the nonvolatile memory device of FIG. 8.

Meanwhile, the resistance change memory device according to an embodiment of the present disclosure may be applied to a three-dimensional nonvolatile memory device. FIG. 8 is a perspective diagram schematically illustrating a three-dimensional nonvolatile memory device 2 according to an embodiment of the present disclosure. FIG. 9 is a partial enlarged view of the nonvolatile memory device 2 of FIG. 8.

Referring to FIG. 8, the nonvolatile memory device 2 may include first conductive lines 810 arranged in an x-direction, second conductive lines 820 arranged in a y-direction, and pillar-shaped structures 80 disposed along a z-direction in each region where the first and second conductive lines 810 and 820 intersect. Although the x-direction and y-direction are illustrated as an orthogonal coordinate system orthogonal to each other, the present disclosure is not limited thereto, and various modifications may exist as long as a condition that the x-direction and the y-direction are not parallel is satisfied. Meanwhile, the pillar-shaped structures 80 may constitute a plurality of arrays along the x-direction and the y-direction. Each of the pillar-shaped structures 80 may constitute a memory cell of the nonvolatile memory device 2.

Referring to FIG. 9, each of the pillar-shaped structures 80 may include a lower electrode 910, a resistance change material layer 920 and an upper electrode 930 that are sequentially disposed on the first conductive line 810. Configurations of the lower electrode 910, the resistance change material layer 920 and the upper electrode 930 may be substantially the same as the configurations of the first electrode layer 110, the resistance change material layer 120 and the second electrode layer 130 of the resistance change memory device 1 described above with reference to FIGS. 1, 2A, 2B, 3A and 3B.

As described above, a resistance state of the pillar-shaped structure 80 may be determined depending on whether a conductive filament is generated or disconnected in the resistance change material layer 920 by an external voltage applied between the first and second conductive lines 810 and 820. The generation or disconnection of the conductive filament may be caused by reversibly converting $sp^2$ bonds and $sp^3$ bonds between carbon atoms of the amorphous carbon structure in the resistance change material layer 920 to each other by applying external voltage as described above.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A resistance change memory device comprising:
a first electrode layer and a second electrode layer that are disposed to be spaced apart from each other; and
a resistance change material layer disposed between the first and second electrode layers and including an amorphous carbon structure,
wherein the resistance change material layer comprises an impurity element adhering to the amorphous carbon structure, and the impurity element has a concentration gradient along a thickness direction of the resistance change material layer.

2. The resistance change memory device of claim 1,
wherein the amorphous carbon structure has carbon atoms with carbon to carbon sp2 bonds and carbon atoms with carbon to carbon sp3 bonds, and
wherein the sp2 bonds and the sp3 bonds are reversibly converted.

3. The resistance change memory device of claim 2,
wherein the resistance change material layer further comprises a conductive filament including carbon atoms having carbon to carbon sp2 bonds.

4. The resistance change memory device of claim 3,
wherein a cross-sectional area of the conductive filament located in a region having a relatively low concentration of the impurity element is greater than that of the conductive filament located in a region having a relatively high concentration of the impurity element.

5. The resistance change memory device of claim 3,
wherein a cross-sectional area of the conductive filament in the resistance change material layer decreases as the concentration of the impurity element increases along a thickness direction of the resistance change material layer.

6. The resistance change memory device of claim 1,
wherein the impurity element is adsorbed to the amorphous carbon structure in a non-chemical bonding state.

7. The resistance change memory device of claim 1,
wherein the impurity element comprises oxygen or hydrogen.

8. The resistance change memory device of claim 1,
wherein a proportion of carbon atoms with carbon to carbon sp2 bonds and a proportion of carbon atoms with carbon to carbon sp3 bonds in the amorphous carbon structure vary along a concentration gradient of the impurity element.

9. The resistance change memory device of claim 8,
wherein the ratio of sp3 bonds to sp2 bonds in the amorphous carbon structure increases as the concentration of the impurity element increases.

10. The resistance change memory device of claim 1,
wherein each of the first and second electrode layers comprises at least one selected from the group consisting of platinum (Pt), gold (Au), silver (Ag), tungsten (W), aluminum (Al), copper (Cu), tantalum (Ta), ruthenium (Ru), iridium (Ir), molybdenum (Mo), tungsten nitride, titanium nitride, tantalum nitride, and doped silicon.

11. A method of manufacturing a resistance change memory device, the method comprising:
forming a first electrode layer on a substrate;
forming a resistance change material layer including an amorphous carbon structure on the first electrode layer; and
forming a second electrode layer on the resistance change material layer,
wherein the forming the resistance change material layer comprises injecting an impurity element into the resistance change material layer, the impurity element having a concentration gradient along a thickness direction of the resistance change material layer.

12. The method of claim 11,
wherein the impurity element comprises oxygen or hydrogen.

13. The method of claim 11,
wherein the forming the resistance change material layer includes a sputtering process with a carbon target and using an oxygen gas or a hydrogen gas as a reactive gas.

14. The method of claim 13,
wherein the forming the resistance change material layer comprises increasing or decreasing a flow rate of the oxygen gas or the hydrogen gas during the sputtering process using the carbon target.

15. The method of claim 11,
wherein at least a portion of the impurity element injected into the resistance change material layer adheres to the amorphous carbon structure.

16. The method of claim 15,
wherein the impurity element is adsorbed to the amorphous carbon structure in a non-chemically bonded state.

17. The method of claim 11,
wherein the forming the resistance change material layer comprises controlling a first impurity element concentration in an inner region of the resistance change material layer adjacent to an interface between the first electrode layer and the resistance change material layer and a second impurity element concentration in an inner region of the resistance change material layer adjacent to an interface between the second electrode layer and the resistance change material layer, and
wherein the first impurity element concentration and the second impurity element concentration are different from each other.

18. The method of claim 11,
wherein the forming the resistance change material layer comprises controlling the concentration of the impurity element to continuously increase or decrease along the thickness direction of the resistance change material layer.

19. The method of claim 11,
wherein each of the first and second electrode layers comprises at least one selected from the group consisting of platinum, gold, silver, tungsten, aluminum, copper, tantalum, ruthenium, iridium, molybdenum, tungsten nitride, titanium nitride, tantalum nitride, and doped silicon.

* * * * *